(12) United States Patent
Abdullah et al.

(10) Patent No.: US 10,553,475 B2
(45) Date of Patent: Feb. 4, 2020

(54) SINGLE LAYER INTEGRATED CIRCUIT PACKAGE

(71) Applicant: QDOS Flexcircuits Sdn Bhd, Bayan Lepas (MY)

(72) Inventors: Zalina Binti Abdullah, Bayan Lepas (MY); Roslan Bin Ahmad, Bayan Lepas (MY); Poh Cheng Ang, Bayan Lepas (MY); Poh Choon Whong, Bayan Lepas (MY); Hai San Tew, Bayan Lepas (MY); Shin Hung Hwang, Bayan Lepas (MY); Chee Can Lee, Bayan Lepas (MY); Tiyagarajan S/O Arumugham, Bayan Lepas (MY)

(73) Assignee: QDOS Flexcircuits Sdn Bhd, Bayan Lepas (MY)

( * ) Notice: Subject to any disclaimer, the term of this patent is extended or adjusted under 35 U.S.C. 154(b) by 0 days.

(21) Appl. No.: 15/476,648

(22) Filed: Mar. 31, 2017

(65) Prior Publication Data
US 2017/0323826 A1 Nov. 9, 2017

(30) Foreign Application Priority Data
Mar. 31, 2016 (MY) .......................... PI 2016701183

(51) Int. Cl.
*H01L 23/31* (2006.01)
*H01L 21/48* (2006.01)
(Continued)

(52) U.S. Cl.
CPC .... *H01L 21/76813* (2013.01); *H01L 21/4832* (2013.01); *H01L 21/568* (2013.01);
(Continued)

(58) Field of Classification Search
CPC . H01L 23/3107; H01L 23/544; H01L 21/568; H01L 21/4832; H01L 21/486; H01L 21/4846; H01L 21/4835; H01L 21/76813; H01L 21/76819; H01L 21/7684; H01L 21/31051; H01L 21/4853; H01L 21/707; H01L 21/3677; H01L 23/13; H01L 2224/48225; H01L 2224/48227; H01L 2224/48235; H01L 2224/16225; H01L 2224/16227; H01L 2224/16235; H01L 24/48; H01L 24/16; H01L 24/45; H01L 2224/48091
See application file for complete search history.

(56) References Cited

U.S. PATENT DOCUMENTS 5,231,757 A 8/1993 Chantraine et al.
9,282,626 B2 3/2016 Yoo
(Continued)

*Primary Examiner* — Michael M Trinh
(74) *Attorney, Agent, or Firm* — Preston Smirman; Smirman IP Law, PLLC

(57) ABSTRACT

An integrated circuit packaging is described, including a plurality of electrical circuits developed using a first patterned conductive layer on a base, wherein an electrical circuit is formed by using a masking material, and an interconnection is developed between the electrical circuits, where the interconnection is disposed on at least one side of the first patterned conductive layer and masking material, in which the interconnection is enclosed with a second masking material to form the integrated circuit packaging.

1 Claim, 2 Drawing Sheets

(51) Int. Cl.
    *H01L 21/768*     (2006.01)
    *H01L 23/00*     (2006.01)
    *H01L 21/70*     (2006.01)
    *H01L 23/367*     (2006.01)
    *H01L 23/13*     (2006.01)
    *H01L 21/56*     (2006.01)

(52) U.S. Cl.
    CPC ............ *H01L 21/707* (2013.01); *H01L 23/13* (2013.01); *H01L 23/3677* (2013.01); *H01L 24/45* (2013.01); *H01L 24/48* (2013.01); *H01L 23/3107* (2013.01); *H01L 2224/48091* (2013.01); *H01L 2224/48227* (2013.01); *H01L 2924/00014* (2013.01)

(56) References Cited

U.S. PATENT DOCUMENTS

| | | |
|---|---|---|
| 2007/0187237 A1 | 8/2007 | San et al. |
| 2008/0289177 A1 | 11/2008 | Lee et al. |
| 2009/0175017 A1 | 7/2009 | Kita |
| 2013/0020710 A1* | 1/2013 | Chew .................. H01L 21/4846 257/762 |
| 2013/0161809 A1* | 6/2013 | Chew .................. H05K 1/0373 257/734 |
| 2013/0175707 A1* | 7/2013 | Chew ................ H01L 23/49537 257/778 |
| 2014/0374150 A1 | 12/2014 | Inagaki |
| 2015/0366062 A1 | 12/2015 | Noda |
| 2016/0343645 A1 | 11/2016 | Pan |

\* cited by examiner

SINGLE LAYER INTEGRATED CIRCUIT PACKAGE

CROSS-REFERENCE TO RELATED APPLICATION

The instant application claims priority to Malaysia Patent Application Serial No. PI 2016701183 filed Mar. 31, 2016, the entire specification of which is expressly incorporated herein by reference.

FIELD OF THE INVENTION

The invention relates in general to an integrated circuit package and manufacturing method thereof, and more particularly to an integrated circuit package having a single layer with ultra-thin characteristics to form an interconnect.

BACKGROUND OF THE INVENTION

Recently, there was an increase in the number of terminals and the narrowing of their pitches in the semiconductor or integrated circuit device which result from advancements in the performance of operations, the capability of performing multi tasks and the integration thereof, which results in the growing demands of the interconnecting substrate for packaging which carries the semiconductor device also attains a higher density in arrangement and interconnections.

The current interconnecting substrate for packaging in-use, which are made of build-up multi-layered substrate, a sort of multi-layered interconnecting substrate.

Glass epoxy print substrates which are used as the base core substrate, which build-up multi-layered substrate is fabricated by forming an epoxy resin layer on both surfaces of this glass epoxy print substrate. Then, forming via holes in these epoxy resin layers by means of photolithography or laser. After that, plating method and the photolithography with a combination of the electroless or electrolytic Cu, in which an interconnection layer and via conductors are formed such that the formation of build-up layered structure is archived.

However, the glass epoxy print substrate may cause a problem that the heat treatments performed in fabrication of the build-up multi-layered substrate may bring the glass epoxy print substrate to a poor condition and create defects. Furthermore, the heat treatments carried out at the time of chip loading and solder reflow may cause the faulty connection and the distortion which affects the long-term reliability for the connection.

Moreover, the interconnecting substrate for packaging is mounted on an external board or apparatus, the stress is structurally centered on the interface between the external electrode terminal and the insulating layer, which tends to give rise to opening defects so that the satisfactory mounting reliability cannot be obtained.

SUMMARY OF THE INVENTION

Therefore the purpose of overcoming the above problems, there have been proposed an integrated circuit package and manufacturing method thereof, and more particularly to an integrated circuit package having a single layer with ultra-thin characteristics to form an interconnect.

One aspect of the present invention provides a method of fabricating an integrated circuit packaging, comprising the steps of:
establishing a base;
developing a plurality of electrical circuits using a first patterned conductive layer on the base, wherein the electrical circuits are formed by using a masking material; and
developing an interconnection between the electrical circuits, where the interconnection is disposed on at least one side of the first patterned conductive layer and masking material, in which the interconnection is enclosed with a second masking material to form the integrated circuit packaging.

Preferably, the thickness of the first patterned conductive layer reduced by trimming or grinding or polishing at least one surface of the first patterned conductive layer.

Further, the surface of the first patterned conductive layer is trimmed by using chemical process or mechanical grinding process or laser trimming process or plasma treatment or any combination thereof.

Preferably, the base is completely removed.

Preferably, the base is selectively removed to form at least an internal opening and at least a positioning opening of the first patterned conductive layer area, wherein the internal opening corresponds with an inside area of the first patterned conductive layer, and the positioning opening corresponds with an outside area of the first patterned conductive layer.

Preferably, the base is a charge carrier.

Another aspect of the present invention provides an integrated circuit packaging, comprising: a plurality of electrical circuits developed using a first patterned conductive layer on the base, wherein the electrical circuit formed by using a masking material; and a interconnection developed between the electrical circuits, where the interconnection disposed on at least one side of the first patterned conductive layer and masking material, in which the interconnection is enclosed with a second masking material to form the integrated circuit packaging.

Preferably, the trimmed surface of the first patterned conductive layer is trimmed by using chemical process, mechanical grinding process, laser trimming process, plasma etching or any combination thereof.

Preferably, the base is selectively removed base, to form at least an internal opening and at least a positioning opening of the first patterned conductive layer exposed area.

Preferably, the base is selectively removed base, to form at least an internal opening and at least a positioning opening of the first patterned conductive layer exposed area, wherein the internal opening corresponds with an inside area of the first patterned conductive layer, and the positioning opening corresponds with an outside area of the first patterned conductive layer.

DETAILED DESCRIPTION OF THE INVENTION

To further clarify various aspects of some embodiments of the present invention, a more particular description of the invention will be rendered by references to specific embodiments thereof, which are illustrated in the appended drawings. It is appreciated that these drawings depict only typical embodiments of the invention and are therefore not to be considered limiting of its scope. The invention will be described and explained with additional specificity and detail through the accompanying drawings in which:

FIGS. 1-14 are detailed process flowcharts of manufacturing and connecting for an integrated circuit package according to a first embodiment of the invention.

Figure 1:
FIG. 1 illustrates an integrated circuit package according to at least one embodiment of the present invention.

FIG. 1 illustrates an integrated circuit package according to at least one embodiment of the invention. Firstly, a carrier or base (101) is established or developed, wherein the base (101) is a steel material or copper or conductive material such as charge carrier. Preferably, the carbon steel or steel has thickness in the range of 0.005-0.500 mm, wherein the plated conductive layer has a thickness in the range of 3-120 µm.

Figure 2:
FIG. 2 illustrates layers of photo-resist materials being developed on a base, in which the layers are then developed or formed as patterned layers of photo-resist materials.

Then, FIG. 2 illustrates layers of photo-resist materials (102) are developed on the base (101), in which the layer is then developed or formed as a patterned layers of photo-resist materials (102). Alternatively, the layers of photo-resist materials (102) are also formed on both surfaces of the carrier or base (101), bottom part and top part. The purpose of photo-resist materials (102) on the top portion is to create a masking for circuit patterning. However, the photo-resist materials (102) on the bottom portion are to avoid unnecessary buildup of plating material to avoid wastage of the plating material. This photo-resist materials (102) has to on the bottom portion of the carrier or base (101) until demasking process. This process also known as dry film laminating process by using dry film laminator process, in which the dry film preferably has a thickness in the range of 5-100 µm.

Figure 3:
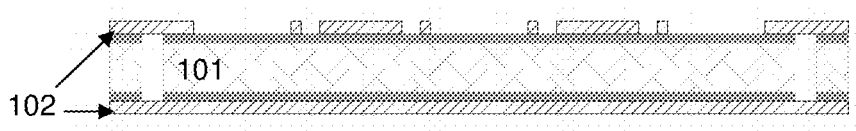
FIG. 3 illustrates the development of an electrically conductive layer within the removed or etched part of the layers of photo-resist materials.
Figure 4:
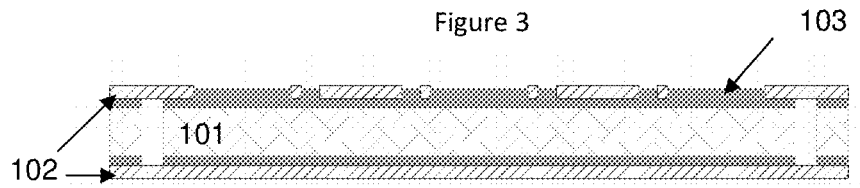
FIG. 4 illustrates layers of photo-resist materials being removed, leaving the electrically conductive layer, wherein the first conductive layer can be used as electrical circuits or electrical routing.

FIG. 3 illustrates development of an electrically conductive layer (103) within the removed or etched part of the layers of photo-resist materials (102). The electrically conductive layer (103) developed by using electroplating method. Thereafter, the layers of photo-resist materials (102) will be removed, leaving the electrically conductive layer (103) wherein the first conductive layer and used as electrical circuits or electrical routing as illustrated in FIG. 4. The layers of photo-resist materials (102) on the bottom part of the carrier or base (101) will still remain. Preferably, the layers of photo-resist materials are removed by Ultra Violet (UV) exposure process, in which the unexposed zone will be removed by developer process. Preferably, the development process of the electrically conductive layer (103) is also known as process of tracing conductive plating by using copper plating line, in which the conductive trace has a thickness in the range of 5~100 µm.

Then, the electrically conductive layer (103) is develop into a plurality of electrical circuits, which are electrically isolated and used as a package trace layout unit or electrical circuits unit, wherein the electrical circuits unit will be electrically connected to each other. This formation has same pattern to the integrated circuit that are ready for packaging.

Figure 5:
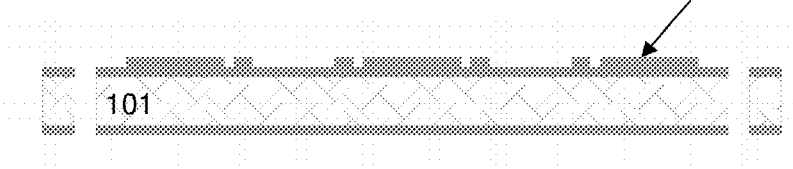
FIG. 5 illustrates the remaining first photo-resist materials being removed or stripped, leaving the electrically conductive layer along the base.

Then the remaining first photo-resist materials (102) will be removed or stripped, leaving the electrically conductive layer (103) along the base (101) as illustrated in FIG. 5. Preferably, this process is known as the process of dry film stripping.

Figure 6:
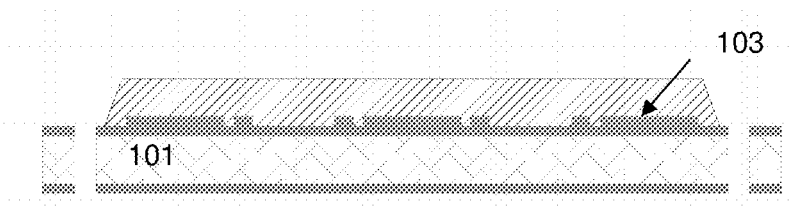
FIG. 6 illustrates an epoxy or polymide process being developed or disposed on the base and the electrically conductive layer.
Figure 7:
FIG. 7 illustrates, on the surface of the disposed epoxy molding compound, there is performed a grinding or polishing or trimming process known as surface grinding by either mechanical wheel grinding or chemical etching process.
Figure 8:
FIG. 8 illustrates the performance of surface finishing on the flattened surface fully or selectively.
Figure 9:
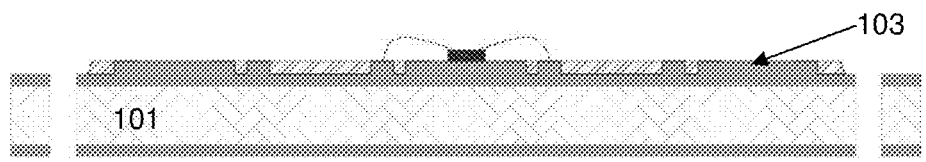
FIG. 9 illustrates the process of wire bonding performed on the flattened surface having the electrically conductive layer or patterned electrically conductive layer, wherein the wire bonding process can also be replaced with any other semiconductor interconnection method such as flip-chip method.
Figure 10:
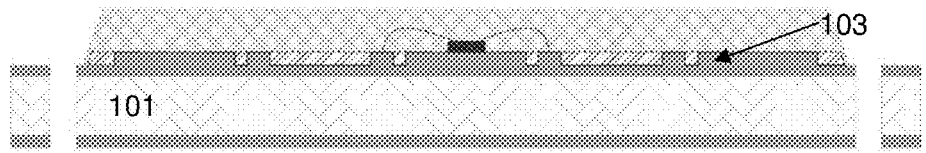
FIG. 10 illustrates, after the process of wire bonding process is performed, a second molding layer is developed enclosing the wire bonded surface area or surrounding areas.

Then epoxy or polymide process is developed or disposed on the base (101) and the electrically conductive layer (103) as illustrated in FIG. 6. This process is known as an encap process by using an epoxy molding or polymide compound. Preferably, by molding or laminate and curing with b-stage adhesive laminate film or laminate and curing with prepreg resin or laminate and curing with resin. Thereafter, on the surface of the disposed epoxy molding compound is performed a grinding or polishing or trimming process known as surface grinding by either mechanical wheel grinding or chemical etching process as illustrated in FIG. 7. Preferably etching process has a thickness in the control range of 5~200 um. The surface grinding will flatten the surface of the electrically conductive layer (103) and the disposed epoxy molding compound or polymide laminate to form a flattened surface area, in which the electrically conductive layer (103) will be flatten by grinding or polishing the surface. Then, perform surface finishing on the flatten surface fully or selectively as shown in FIG. 8. FIG. 9 illustrates the process of wire bonding performed on the flattened surface having the electrically conductive layer (103) or patterned electrically conductive layer (103), the wire bonding process can also be replaced with any other semiconductor interconnection method such as flip-chip method. After the process of wire bonding process is performed, a second molding layer is developed enclosing the wire bonded surface area or surrounding areas as shown in FIG. 10.

Figure 11:
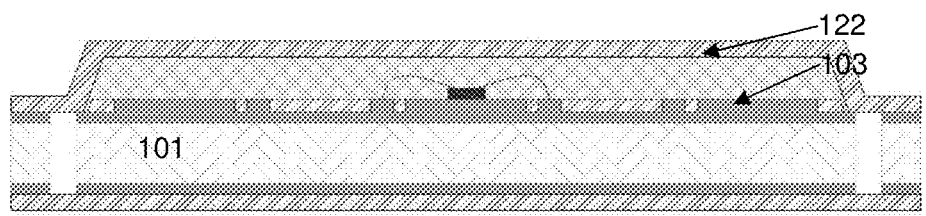
FIG. 11 illustrates layers of third photo-resist materials being developed on the flat surface area of the surface of the electrically conductive layer and the wire bonded surface as well as bottom portion of the base.

Further, the process includes layers of third photo-resist materials (122) is developed on the flat surface area of the surface of the electrically conductive layer (103) and the wire bonded surface as well as bottom portion of the base as illustrated in FIG. 11. This process also known as dry film laminate with a dry film laminator, in which the dry film preferably has a thickness in the range of 15~63 μm.

Figure 12:
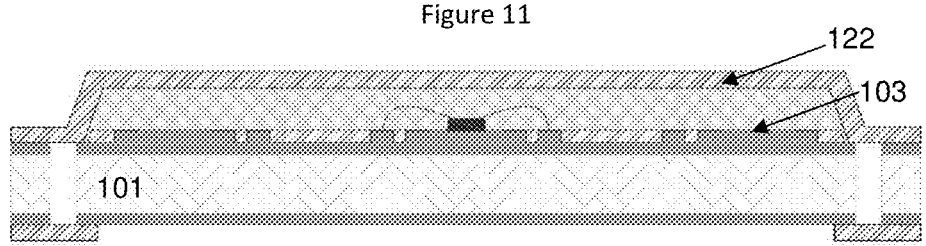
FIG. 12 illustrates a window etching exposure process where the dry film laminate and UV are exposed on both sides, where the bottom dry film opens after the window etching exposure process.
Figure 13:
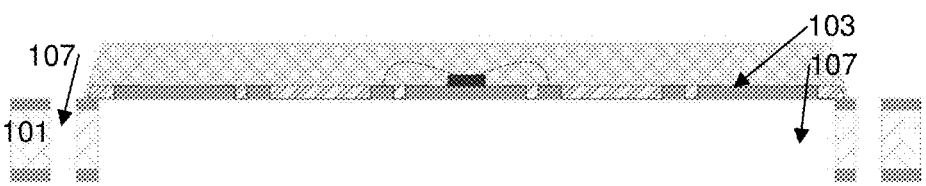
FIG. 13 illustrates the base being stripped with the dry film laminate creating an opening exposing at least one part of the bottom portion of the electrically conductive layer and molding compound.
Figure 14:
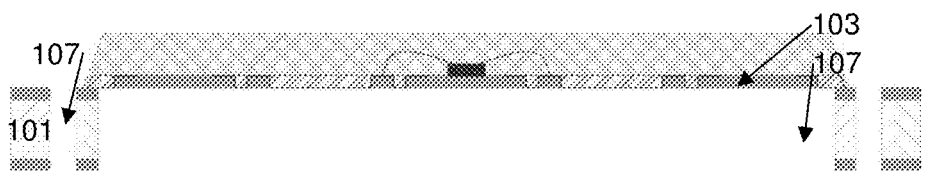
FIG. 14 illustrates surface finishing being performed on the surface of the second molding layer fully or selectively.

FIG. 12 shows a window etching exposure process where the dry film laminate and UV exposed on both sides, where the bottom dry film opens after the window etching exposure process. Then, the base is stripped with the dry film laminate creating an opening exposing at least one part of the bottom portion of the electrically conductive layer (103) and molding compound as shown in FIG. 13. Finally, surface finishing performed on the surface of the second molding layer fully or selectively as shown in FIG. 14.

Thereafter, the base (101) can be removed fully or selectively to form at least an internal opening and at least a positioning opening, wherein the internal opening corresponds with an inside area of the first patterned conductive layer (103), and the positioning opening corresponds with an outside area of the first patterned conductive layer (103). The base (101) also can be removing at least one part of the first patterned conductive layer (103), such that the area of the first patterned conductive layer (103) are exposed to form at least an internal opening (107) and at least a positioning opening (107) or at least an internal opening (107) or positioning opening (107) as illustrated in FIGS. 13 and 14.

The present invention may be embodied in other specific forms without departing from its essential characteristics. The described embodiments are to be considered in all respects only as illustrative and not restrictive. The scope of the invention is, therefore indicated by the appended claims rather than by the foregoing description. All changes, which come within the meaning and range of equivalency of the claims, are to be embraced within their scope.

What is claimed is:

1. A method of fabricating an integrated circuit packaging, comprising the steps of:

providing a base, wherein the base is a charge carrier;

applying a first masking layer on a top surface layer of the base;

removing a portion of the first masking layer to expose a plurality of portions of the top surface layer of the base;

disposing a conductive material in the plurality of exposed portions on the top surface layer of the base to form a patterned conductive layer;

developing the patterned conductive layer into a plurality of electrical circuits;

applying an encap process on the base and the patterned conductive layer by disposing a lamination compound thereon and curing with a resin;

flattening a surface of the patterned conductive layer and the disposed lamination compound;

developing an interconnection between the electrical circuits, where the interconnection is disposed on a top surface of the patterned conductive layer, in which the interconnection is enclosed with a second masking layer to form the integrated circuit packaging; and selectively removing the base to form an internal opening and a positioning opening of the patterned conductive layer area, wherein the internal opening corresponds with an inside area of the patterned conductive layer, and the positioning opening corresponds with an outside area of the patterned conductive layer;

wherein a thickness of the patterned conductive layer is reduced by trimming or grinding or polishing at least one surface of the patterned conductive layer;

wherein the surface of the patterned conductive layer is trimmed by using a chemical process, mechanical grinding process, laser trimming process, plasma treatment, or any combination thereof.

\* \* \* \* \*